United States Patent [19]
Koh

[11] Patent Number: 5,493,096
[45] Date of Patent: Feb. 20, 1996

[54] THIN SUBSTRATE MICRO-VIA INTERCONNECT

[75] Inventor: Wei H. Koh, Irvine, Calif.

[73] Assignee: Grumman Aerospace Corporation, Bethpage, N.Y.

[21] Appl. No.: 240,979

[22] Filed: May 10, 1994

[51] Int. Cl.⁶ .................................................. B23K 26/00
[52] U.S. Cl. ...................................... 219/121.71; 427/554
[58] Field of Search ........................... 219/121.7, 121.71; 216/17, 18, 19, 39, 65, 94; 156/644.1; 427/554

[56] References Cited

U.S. PATENT DOCUMENTS

| | | | |
|---|---|---|---|
| 3,956,052 | 5/1976 | Koste et al. | 219/121.71 |
| 4,168,992 | 9/1979 | Anthony et al. | 148/1.5 |
| 4,170,490 | 10/1979 | Anthony et al. | 148/1.5 |
| 4,304,624 | 12/1981 | Carson et al. | 156/630 |
| 4,354,107 | 10/1982 | Carson et al. | 250/239 |
| 4,403,238 | 9/1983 | Clark | 357/30 |
| 4,551,629 | 11/1985 | Carson et al. | 250/578 |
| 4,618,763 | 10/1986 | Schmitz | 250/211 |
| 4,646,128 | 2/1987 | Carson et al. | 357/74 |
| 4,703,170 | 10/1987 | Schmitz | 250/211 |
| 4,706,166 | 11/1987 | Go | 361/403 |
| 4,764,846 | 8/1988 | Go | 361/388 |
| 4,792,672 | 12/1988 | Schmitz | 250/211 |
| 4,794,092 | 12/1988 | Solomon | 437/51 |
| 4,857,477 | 8/1989 | Kanamori | 437/47 |
| 4,870,031 | 9/1989 | Sugahara et al. | 437/82 |
| 4,948,941 | 8/1990 | Altman et al. | 219/121.71 |
| 4,956,694 | 9/1990 | Eide | 357/74 |
| 4,978,420 | 12/1990 | Bach | 156/643 |
| 4,992,393 | 2/1991 | Kosaka et al. | 437/83 |
| 4,992,908 | 2/1991 | Solomon | 361/400 |
| 5,013,687 | 5/1991 | Solomon | 437/209 |
| 5,100,501 | 3/1992 | Blumenthal et al. | 216/18 |
| 5,213,876 | 5/1993 | Smyth, Jr. et al. | 219/121.71 |
| 5,315,147 | 5/1994 | Solomon | 257/448 |
| 5,316,803 | 5/1994 | White, Jr. et al. | 427/554 |
| 5,360,491 | 11/1994 | Carey et al. | 427/554 |
| 5,451,291 | 9/1995 | Park et al. | 156/644.1 |

FOREIGN PATENT DOCUMENTS

| | | | |
|---|---|---|---|
| 59-33091 | 2/1984 | Japan | 219/121.71 |
| 62-93091 | 4/1987 | Japan | 219/121.71 |

*Primary Examiner*—Geoffrey S. Evans
*Attorney, Agent, or Firm*—Stetina Brunda & Buyan

[57] ABSTRACT

A method for forming conductive via interconnects utilizes the steps of: applying a sacrificial coating to at least one surface of a substrate; laser drilling the substrate through the sacrificial coating to form a via through-hole; applying a conductive coating to the via through-hole; and removing the sacrificial coating(s). Recasting and shattering thus occur in the sacrificial coating rather than in the substrate during the step of laser drilling so as to enhance via through-hole geometry.

69 Claims, 2 Drawing Sheets

THIN SUBSTRATE MICRO-VIA INTERCONNECT

FIELD OF THE INVENTION

The present invention relates generally to integrated circuitry packaging and more particularly to a method for forming conductive via interconnects with integral contact bumps wherein a sacrificial coating is applied to the substrate so as to prevent recasting and/or shattering of the substrate during laser drilling and also so as to facilitate accurate deposition of a conductive materials within the via through-hole.

BACKGROUND OF THE INVENTION

The infrared spectrum covers a range of wavelengths longer than the visible wavelengths but shorter than microwave wavelengths. Visible wavelengths are generally regarded as between 0.4 and 0.75 micrometers. The near infrared wavelengths extend from 0.75 micrometers to 10 micrometers. The far infrared wavelengths cover the range from approximately 10 micrometers to 1 millimeter. The function of infrared detectors is to respond to energy of a wavelength within some particular portion of the infrared region.

Heated objects dissipate thermal energy having characteristic wavelengths within the infrared spectrum. Different levels of thermal energy, corresponding to different sources of heat, are characterized by the emission of signals within different portions of the infrared frequency spectrum. No single detector is uniformly efficient over the entire infrared frequency spectrum. Thus, detectors are selected in accordance with their sensitivity in the range of interest to the designer. Similarly, electronic circuitry that receives and processes the signals from the infrared detector must also be selected in view of the intended detection function.

A variety of different types of infrared detectors have been proposed in the art since the first crude infrared detector was constructed in the early 1800's. Virtually all contemporary infrared detectors are solid state devices constructed of materials that respond to infrared frequency energy in one of several ways. Thermal detectors respond to infrared frequency energy by absorbing that energy causing an increase in temperature of the detecting material. The increased temperature in turn causes some other property of the material, such as resistivity, to change. By measuring this change the infrared radiation is measured.

Photo-type detectors (e.g., photoconductive and photovoltaic detectors) absorb the infrared frequency energy directly into the electronic structure of the material, inducing an electronic transition which, in turn, leads to either a change in the electrical conductivity (photoconductors) or to the generation of an output voltage across the terminals of the detector (photovoltaic detectors). The precise change that is effected is a function of various factors including the particular detector material selected, the doping density of that material and the detector area.

By the late 1800's, infrared detectors had been developed that could detect the heat from an animal at one quarter of a mile. The introduction of a focusing lenses constructed of materials transparent to infrared frequency energy, as well as advances in semiconductor materials and highly sensitive electronic circuity have advanced the performance of contemporary infrared detectors close to the ideal photon limit.

Current infrared detection systems incorporate arrays of large numbers of discrete, highly sensitive detector elements the outputs of which are connected to sophisticated processing circuitry. By rapidly analyzing the pattern and sequence of detector element excitations, the processing circuitry can identify and monitor sources of infrared radiation. Though the theoretical performance of such systems is satisfactory for many applications, it is difficult to actually construct structures that mate a million or more detector elements and associated circuitry in a reliable and practical manner. Consequently, practical applications for contemporary infrared detection systems have necessitated that further advances be made in areas such as miniaturization of the detector array and accompanying circuitry, minimization of noise intermixed with the electrical signal generated by the detector elements, and improvements in the reliability and economical production of the detector array and accompanying circuitry.

A contemporary subarray of detectors may, for example, contain 256 detectors on a side, or a total off 65,536 detectors, the size of each square detector being approximately 0.0035 inches on a side with 0.0005 inches spacing between detectors. The total width of such a subarray would therefore be 1.024 inches on a side. Thus, interconnection of such a subarray to processing circuitry requires a connective module with sufficient circuitry to connect each of the 65,536 detectors to processing circuitry within a square a little more than one inch on a side. The subarrays may, in turn, be joined to form an array that includes 25 million detectors or more. Considerable difficulties are presented in aligning the detector elements with conductors on the connecting module and in isolating adjacent conductors in such a dense environment.

The outputs of the detectors must undergo a series of processing steps in order to permit derivation of the desired information. The more fundamental processing steps include preamplification, tuned bandpass filtering, clutter and background rejection, multiplexing and fixed noise pattern suppression. By providing a detector connecting module that performs at least a portion of the signal processing functions within the module, i.e., on integrated circuit chips disposed adjacent the detector focal plane, the signal from each detector need be transmitted only a short distance before processing. As a consequence of such on-focal plane or "up front" signal processing, reductions in size, power and cost of the main processor may be achieved. Moreover, up front signal processing helps alleviate performance, reliability and economic problems associated with the construction of millions of closely spaced conductors connecting each detector element to the main signal processing network.

Various constructions have been proposed to support the necessary connectivity and processing functions of the module. Those constructions have heretofore included the formation of a multi-layer passive substrate having metalized patterns formed thereon. Electronic devices such as integrated circuits are mounted on one or more of the substrate layers and connected to the metalized patterns to communicate signals between the electronic devices and the detector elements or external electronics.

The interconnection of conductive conduits formed upon opposite sides of each layer of such a multi-layer substrate is typically accomplished by the use of conductive vias wherein a thin conductive film is sputter-coated into a through-hole interconnecting each side of the layer or substrate. However, the effectiveness and reliability of such conductive via metal interconnects is substantially limited by the aspect ratio (through-hole opening diameter to depth ratio) of the via and is dependent upon the amount of metal deposited within the via. Typically, the sputter-coated metals deposited within a via are substantially thinner than those formed upon the outside surfaces of the substrate, frequently resulting in ineffective and unreliable electrical interconnection.

Multi-layer Z-modules, as disclosed in U.S. Pat. No. 4,703,170 issued to SCHMITZ on Oct. 27, 1987 and entitled INFRARED FOCAL PLANE MODULE and disclosed in U.S. Pat. No. 5,093,708 issued to SOLOMON on Mar. 3, 1992 and entitled MULTI-LAYER INTEGRATED CIRCUIT MODULE, the contents of both of which are hereby incorporated by reference, utilize ceramic substrates having two-sided metalization wherein interconnection of the conductive conduits formed upon opposing sides of the substrate is effected with gold thin-film metalized through-holes drilled by a small laser beam with inner diameters of less than 50 microns. Sputter-coating is typically applied from both sides of the substrate so as to provide more complete coverage of the metalization layer within the via through-hole.

Since the via through-hole depth, i.e., the thickness of the substrate, is several times greater than the diameter of the via openings, the amount of metal deposited within the via through-hole is typically substantially less than that formed upon the exterior surfaces of the substrate. For example, it has been found that in a 100 micron thick substrate with 40 micron diameter via holes, that a 1 micron thick deposit on the exterior surface typically results in an equivalent thickness of less than 0.1 micron inside the via through-hole.

Subsequent processing of the substrate frequently results in damage to the thin-film metalization layer formed within the via. Such damage occurs due to physical, chemical, and thermal stresses inherent to such subsequent processing. Physical damage may result from foreign materials being undesirably introduced into the via during such processing. Chemical damage may result from the effects of corrosive agents and/or solvents being deposited within the via through-hole during such subsequent processing. Thermal stress is typically inherent to subsequent processing of the substrate wherein various materials are deposited upon the substrate, typically via thermal processes, and wherein various components may be attached to the substrate via thermal bonding. As such, failure of the via interconnection may occur, typically where the metalization layer is thinnest, i.e., proximate the mid-point of the via through-hole.

Multi-layered micro circuit boards such as ceramic layers utilized in the fabrication of infrared detectors z-modules, metalized through-hole interconnects are commonly used to provide electrical interconnection for circuitry formed upon the two sides of the substrate. Laser-drilled vias with sizes between 20–50 microns in diameter are typically formed upon ceramic substrates of approximately 80–120 microns in thickness to facilitate this process.

Sputter-coated thin-film metalization has been used as one method of metalizing such via through-holes. However, such sputtering is typically effective only when the aspect ratio (the ratio of the depth of the via through-hole to the diameter thereof) of the vias is small, typically less than 2, and the processing temperature is low, typically less than 300° C. For via interconnects to be processed at higher temperatures, thick-film via-fill materials must be utilized.

Even when thin-film via interconnect successfully pass electrical acceptance testing subsequent to such processing, it is possible for the via interconnect to degrade due to the effects of aging and thermal stress, thereby causing latent failures.

One way to overcome the problems inherent in the use of such thin-films deposited within via through-holes is to fill the via through-holes so as to create impermeable plugs which provide high conductivity.

However, previous attempts to fill through-holes so as to create impermeable plugs while providing high conductivity have, to date, been ineffective in providing a satisfactory product.

When such plugs or thick-film gold conductive materials are used, the via-fill materials usually shrink considerably upon sintering. To fully plug and fill up the vias, repetitive fill and sintering steps are typically required. Alternatively, an excess of the via-fill material may be left on the surface of the substrate. After sintering, the excess surface material must be removed by an appropriate method such as grinding and/or lapping. This approach, however, often results in smearing of the via-fill material upon the substrate surface. Even when the top layer of the substrate is lapped off, the remaining surface may not be sufficiently cleaned to meet the requirements for subsequent thin-filled sputter coating. Furthermore, such lapping of the surface itself creates additional problems. For example, the substrate with which the process is commenced must be substantially thicker than otherwise required, so as to compensate for the thickness of the substrate which is removed during the lapping process. As those skilled in the art will appreciate, the lapping process further creates additional yield loss due to breakage and thickness variations.

According to contemporary methodology, laser drilling is applied to either bare substrates or substrates precoated with a thin metallic coating. When laser energy is applied to a substrate directly, the localized intensive heat cause thereby often result in recasting of the material surrounding the perimeter of the laser beam. For brittle materials, such as ceramics, the sudden thermal shock may result in shattering of the surrounding materials.

Application of a thin metalized coating helps to better dissipate the thermal shock and thus reduce the amount of shattering but slag and cracking still persist. However, in any case, via through-holes having irregularly shaped, shattered, or recast edges resulted from the laser drilling process can cause imperfect metalization patterns. Thus, reduced reliability occurs in the contact between the surface metalization and the via-fill material.

As such, it is beneficial to provide a method for forming conductive via interconnects wherein a sacrificial coating is applied to the substrate so as to prevent recasting and shattering of the substrate during laser drilling and also so as to facilitate accurate screen printing of conductive materials within the via through-hole.

SUMMARY OF THE INVENTION

The present invention specifically addresses and alleviates the above-mentioned deficiencies associated with the prior art. More particularly, the present invention comprises a method for forming conductive via interconnects wherein the method comprises the steps of: applying a sacrificial coating to at least one surface of a substrate; laser drilling the substrate through the sacrificial coating to form a via through-hole; applying a conductive coating to the via through-hole; and removing the sacrificial coating(s). Recasting and shattering thus occur in the sacrificial coating rather than in the substrate proper during the step of laser drilling so as to enhance via through-hole geometry.

The sacrificial coating is preferably applied to both surfaces of the substrate which are connected by the via through-hole. The sacrificial coating preferably comprises either dielectric compositions fireable between 500°–800° C. or polymers that can be decomposed at temperature greater than approximately 400° C. Those skilled in the art will recognize that various other sacrificial coating materials are likewise suitable.

The substrate preferably comprises a ceramic substrate. The substrate preferably has a thickness of approximately 80–120 microns but may range between 50–200 microns. Those skilled in the art will recognize that various other substrate materials are likewise suitable.

Laser drilling is preferably performed with either an eximer laser, $CO_2$ or a YAG laser.

The substrate is preferably drilled as to form a via through-hole having a diameter of less than approximately 50 microns. Thus, the aspect ratio (the ratio of the length of the via through-hole divided by the diameter of the via through-hole) may range from 1 to 4.

The conductive coating is preferably applied to the via through-hole by either screen printing or stenciling. Those skilled in the art will recognize that various other processes for applying conductive pastes to such via through-holes are likewise suitable. Use of the sacrificial coating facilitates alignment of the applied conductive coating to the via through-hole. Thus, the sacrificial coating functions as a mask during application of the conductive coating, thus improving the accuracy with which such conductive coatings are applied.

Optionally, the via through-hole may be filled with an insulator, preferably glass, after the conductive coating has been applied thereto, thus sealing and plugging the via through-hole.

Alternatively, the step of applying a conductive coating to the via through-hole may be postponed or omitted from the process such that the conductive coating may be applied at a later time, if desired.

Thus, according to the process of the present invention the via through-hole is filled and the fill material then sintered and throughout the entire depth of the via through-hole. The use of a sacrificial coating eliminates the need for lapping. The substrate thickness thus remains intact, eliminating the requirement for thicker starting substrates as required according to contemporary methodology. The process allows the original thin-filmed substrate surface to be free from contamination. Also, yield loss associated previously with the lapping process is eliminated.

Not only is the via-filled process simplified and yield increased, but the process of the present invention additionally offers an important added advantage in laser-drilled via through-hole fabrication, In the prior art, laser-drilling is applied to either bare substrates are substrates pre-coated with a thin metallic coating. The use of laser energy applied directly to such a substrate inherently results in localized intensive heat buildup and consequent recasting of the material surrounding the parameter of the laser beam.

For brittle materials such as ceramics, the sudden thermal shock may also result in shattering of the surrounding substrate material. Application of a thin metalized coating helps better dissipate the thermal shock and thus reduces the amount of shattering. But recast and shattering still cannot be eliminated totally. Via through-holes having irregularly shaped, shattered, or recasted edges, may cause imperfect metalization patterns and thus cause less reliable contact between the surface metalization and the via-fill material.

The sacrificial coating applied according to the present invention mitigates the occurrence of such recasting and shattering since such recasting and shattering tend to occur in the protective coating rather than in the substrate proper. When such sacrificial coatings are removed, the actual via through-holes thus have significantly improved geometry, making contact between the via-fill material and the starter coated surface metalization more reliable.

DETAILED DESCRIPTION OF THE PREFERRED EMBODIMENT

The detailed description set forth below in connection with the appended drawings is intended as a description of the presently preferred embodiment of the invention, and is not intended to represent the only form in which the present invention may be constructed or utilized. The description sets forth the functions and sequence of steps for constructing and operating the invention in connection with the illustrated embodiment. It is to be understood, however, that the same or equivalent functions and sequences may be accomplished by different embodiments that are also intended to be encompassed within the spirit and scope of the invention.

Figure 5:
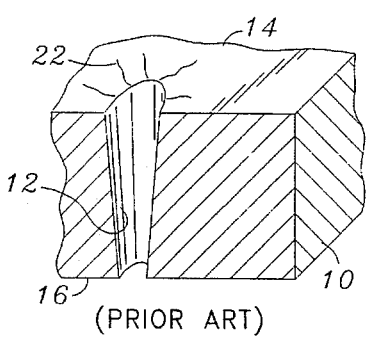
FIG. 5 is an enlarged cross-sectional perspective view of a micro-via formed within a substrate wherein the laser drilling process has resulted in fractures or cracks formed about the opening of the via such as commonly occurs when brittle substrates are utilized according to the prior art.
Figure 6:
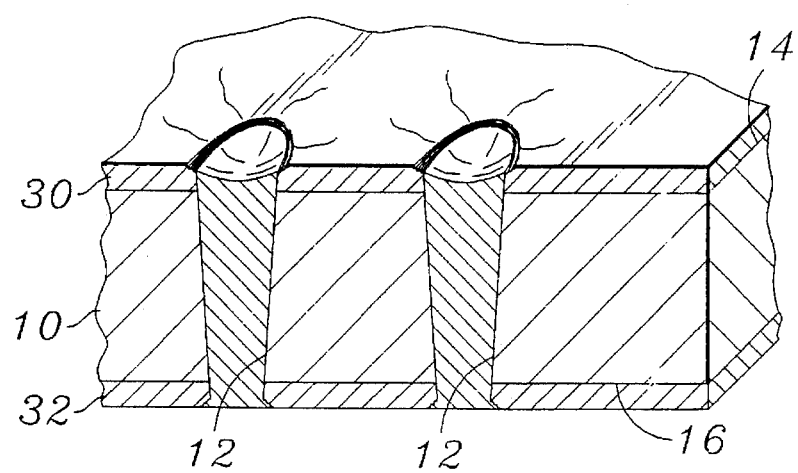
FIG. 6 is a cross-sectional perspective view of a substrate having a protective coating formed upon both the upper and lower surfaces thereof and having micro-vias formed therethrough such that recasting occurs within the protective coating according to the present invention.
Figure 7:
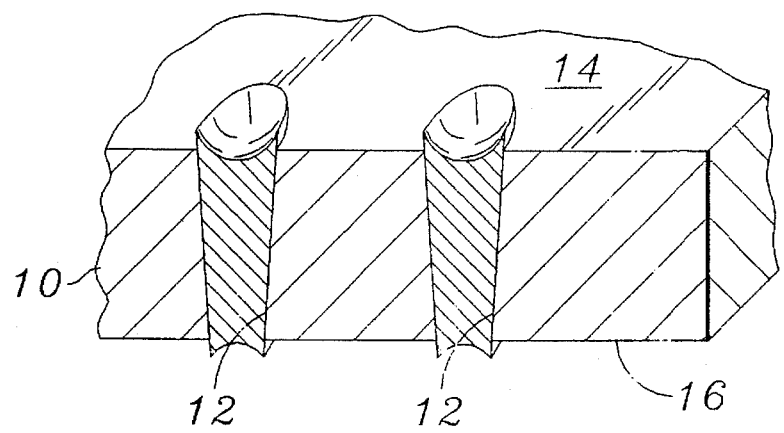
FIG. 7 is a cross-sectional perspective view of the substrate of FIG. 6 subsequent to removal of the protective coatings thereof according to the present invention.

The thin substrate micro-via interconnect of the present invention is illustrated in FIGS. 6 and 7 which depict a presently preferred embodiment of the invention. FIGS. 1–5 depict prior art vias.

Figure 1:
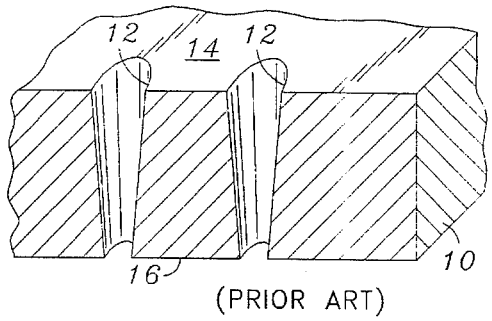
FIG. 1 is a cross-sectional perspective view of a substrate having laser formed micro-vias according to the prior art.

Referring now to FIG. 1, prior art micro-via interconnects are formed by first laser drilling apertures 12 in a substrate 10. Typically, the opening of each aperture 12 in the upper surface 14 of the substrate 10 is of a larger diameter than that formed in the lower surface 16 thereof.

Figure 2:
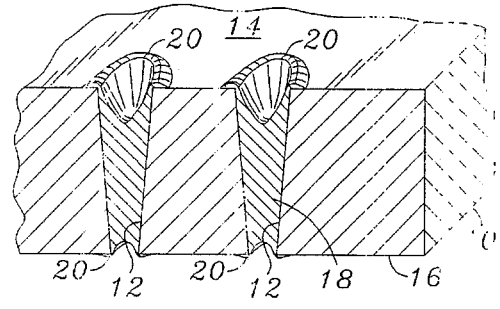
FIG. 2 is a cross-sectional perspective view of the substrate of FIG. 1 having via-fill material disposed within the micro-vias and sintered therein according to the prior art.

Referring now to FIG. 2, the apertures 12 are next filled with a conductive material 18. The conductive material 18 is then sintered. The sintered conductive material 18 commonly shrinks substantially during the sintering process.

Ridges 20 of sintered material are formed upon the upper surface 14 of the substrate as well as the lower surface 16 thereof.

Figure 3:
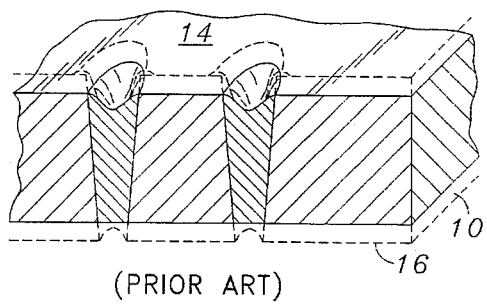
FIG. 3 is a cross-sectional perspective view of the substrate of FIGS. 1 and 2 subsequent to lapping the upper and lower surfaces thereof so as to remove excess material formed upon the surfaces of the substrate according to the prior art.

Referring now to FIG. 3, the upper 14 and lower 16 surfaces of the substrate 10 are next lapped so as to remove the ridges 20 formed upon the upper 14 and lower 16 surfaces of the substrate 10. However, as those skilled in the art will recognize, such lapping has an inherent disadvantages. For example, the starting substrates must be thicker if they are to be lapped, so as to compensate for the reduction in thickness resulting from such lapping. Also, lapping typically results in increased yield loss due to breakage and thickness variation. Also, even when the entire surface of the substrate is lapped off, the remaining surface may still not be sufficiently clean to meet the requirement for subsequent thin-filmed sputter-coating.

Figure 4:
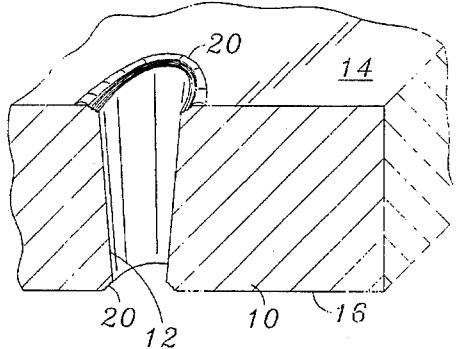
FIG. 4 is an enlarged cross-sectional perspective view of a substrate having a laser-formed micro-via wherein the laser drilling process has resulted in the formation of a slag or recast material ring about the openings of the micro-via according to the prior art.

Referring now to FIG. 4, laser drilling of either bare substrates or substrates precoated with a thin metallic coating has inherent disadvantages as well. For example, when laser energy is applied to a substrate directly, the localized intensity of heat often results in a recast ring 20 formed about the parameter of the laser formed aperture 12, typically upon both the upper 14 and lower 16 surfaces of the substrate. The recast material of ring 20 results from material which is temporarily melted, but thereafter immediately recondenses upon each surface 14 and 16, of the substrate 10.

Referring now to FIG. 5, brittle substrate materials, such as ceramics, commonly crack due to thermal shock during the laser drilling process. Such cracking or shattering of the substrate 10 results in cracks 22 extending radially from the aperture 12 in both the upper 14 and lower 16 surfaces of the substrate.

The application of a thin metalized coating provides some relief by dissipating the thermal energy of the laser drilling process, and thereby reduces the amount of shattering. Nevertheless, the recast ring cannot be eliminated, even with the application of thin metal films prior to laser drilling.

Via through-holes having irregularly shaped, shattered, or recast edges typically result in defects during subsequent thin-filmed sputtering and photo etching processes utilized to form circuit patterns upon the substrate 10. Poor connections or missing metal between the substrate surface and the through-holes may result in open circuits between the two sides of the substrate.

Referring now to FIGS. 6 and 7, the process of the present invention is described. With particular reference to FIG. 6, a sacrificial coating 30 is applied to the upper surface 14 of the substrate 10 and a similar sacrificial coating 32 is applied to the lower surface 16 of the substrate 10. The sacrificial coatings 30 and 32 are preferably 10–30 microns thick and are applied prior to laser drilling of the substrate 10. Thus, during the laser drilling process, recasting and shattering occurs within the protective coatings 30 and 32, rather than within the substrate 10.

With particular reference to FIG. 7, the sacrificial coatings 30 and 32 are removed after completion of the laser drilling process such that the substrate 10 lacks recast rings and/or cracks which would otherwise be formed therein.

Optionally, conductive material may be disposed within the apertures 12 and sintered prior to removal of the sacrificial coatings 30 and 32.

As such, according to the methodology of the present invention, the need to lap the substrate 10 after completion of the laser drilling and hole fill processes is eliminated, thereby likewise eliminating the undesirable consequences of such lapping.

The sacrificial coatings 30 and 32 preferably comprises a thick-film dielectric composition paste material. The substrate 10 is preferably a ceramic material suitable for thin-film sputter-coating and the paste or thick-film dielectric composition is preferably a glass encapsulant fireable between 500°–800° C. The metalization or coating materials are sintered accordingly and the process is preferably repeated for the opposite side of the substrate. Alternatively, both sides may be screen printed and then sintered simultaneously. Typically, the thickness of the sintered material is between approximately 10–30 microns.

Laser formed through-holes are preferably formed through the substrate utilizing a YAG, $CO_2$, or eximer laser.

When glass compositions are used as coatings, the via-fill materials are preferably sintered at a maximum temperature which is below the melting-reflow temperature of the sacrificial coatings.

Removal of the sacrificial coatings 30 and 32 is preferably performed by soaking the substrate 10 in a solution that will dissolve the encapsulate or sacrificial coating material. The substrate 10 is then cleaned such that the sacrificial coatings 30 and 32 are completely removed. Subsequent thin-filmed sputtering and photo etching processes may then be utilized to generate desired circuit patterns upon both sides of the substrate 10. When an organic coating material is used as the sacrificial coatings, sintering of the via-fill material at temperatures about the decomposition point of the polymer will cause the organics to ash, thus post-sintering cleaning can be by dusting off the residual ashes on the surfaces.

The process of the present invention may be applied to many thin-filmed ceramic multi-chip modules and high density interconnect packages where hybrids require interconnection of the two sides thereof.

Thus, the glass composition encapsulant material or sacrificial coating is thin enough to permit laser forming of the via through-holes yet provides enough thermal protection to the substrate so as to prevent thermally-induced damage thereto. The sacrificial coatings act as sacrificial layers by absorbing substantially all of the recasting, slag, and cracks and shattering resulting from the laser drilling process. When the sacrificial coatings are removed from the substrate, the substrates are substantially defect-free and have well-defined geometry substantially lacking the imperfections or defects commonly associated with recast and slag formation as is typical with contemporary methodology.

By controlling the thickness of the sacrificial coating relative to the shrinkage of the thick-film via fill material, it is possible to fabricate filled vias having bumps protruding slightly above the surface, thus forming contact bumps which may form integral portions of the via interconnects.

It is understood that the exemplary thin substrate microvia interconnect of the present invention described herein and shown in the drawings represents only a presently preferred embodiment thereof. Indeed, various modifications and additions may be made to such embodiment without departing from the spirit and scope of the invention. For example, the process may be applied to various different substrate materials having various different shapes and/or configurations. Also, those skilled in the are will recognize that various different materials are suitable for use as the sacrificial layer. Thus, these and other modifications and additions may be obvious to those skilled in the art and may be implemented to adapt the present invention for use in a variety of different applications.

What is claimed is:

1. A method for forming a conductive via interconnect, the method comprising the steps of:

a) applying a sacrificial coating, of a high melting temperature polymer, to at least one surface of a substrate;

b) laser drilling the substrate through the sacrificial coating to form a via through-hole;

c) applying a conductive coating to the via through-hole; and d) removing the at least one sacrificial coating(s);

e) wherein recasting and shattering occur in the sacrificial coating(s) rather than in the substrate during the step of laser drilling so as to enhance via through-hole geometry.

2. The method as recited in claim 1 wherein the step of applying a sacrificial coating to at least one surface of the substrate comprises applying a sacrificial coating to two surfaces of the substrate.

3. The method as recited in claim 1 wherein the polymer has a melting temperature less than approximately 400° C.

4. The method as recited in claim 1 wherein the polymer has a melting temperature less than approximately 400° C. and further comprising the step of filling the via through-hole with a glass dielectric composition fireable between approximately 500° and 800° C.

5. The method as recited in claim 1 wherein the step of applying a sacrificial coating to at least one surface of a substrate comprises applying a sacrificial coating to at least one surface of a ceramic substrate.

6. The method as recited in claim 1 wherein the step of laser drilling the substrate comprises laser drilling the substrate with at least one of an eximer laser and a YAG laser.

7. The method as recited in claim 1 wherein the step of applying a sacrificial coating to at least one side of a substrate comprises applying a sacrificial coating to at least one side of a substrate having a thickness of greater than approximately 100 microns.

8. The method as recited in claim 1 wherein the step of laser drilling the substrate comprises laser drilling the substrate so as to form a through-hole having a diameter of less than approximately 50 microns.

9. The method as recited in claim 1 wherein the step of laser drilling the substrate comprises laser drilling the substrate so as to form a via through-hole having an aspect ratio of greater than approximately 2.

10. The method as recited in claim 1 wherein the step of applying a conductive coating to said via through-hole comprises screen printing.

11. The method as recited in claim 1 wherein the step of applying a conductive coating to said via through-hole comprises spraying.

12. The method as recited in claim 1 further comprising the steps of filling the via through-hole with an insulator after the step of applying a conductive coating to the via through-hole and then sintering.

13. The method as recited in claim 1 further comprising the step of filling the via through-hole with glass after the step of applying a conductive coating to the via through-hole and then sintering.

14. The method as recited in claim 1 wherein the step of applying a sacrificial coating comprises applying an organic sacrificial coating and further comprising the step of sintering the conductive coating applied to the via through-hole at a temperature above the decomposition point of the sacrificial coating so as to cause the sacrificial coating to decompose.

15. The method as recited in claim 14 further comprising the step of removing the decomposed sacrificial coating by dusting off residual ashes formed by sintering of the sacrificial coating.

16. A method for forming a via through-hole, the method comprising the steps of:

a) applying a sacrificial coating formed as a polymer to at least one surface of a substrate;

b) laser drilling the substrate through the sacrificial coating to form a via through-hole; and c) removing the at least one sacrificial coating(s);

d) wherein recasting and shattering occur in the sacrificial coating(s) rather than in the substrate during the step of laser drilling so as to enhance via through-hole geometry.

17. The method as recited in claim 16 wherein the step of applying a sacrificial coating to at least one surface of the substrate comprises applying a sacrificial coating to two surfaces of the substrate.

18. The method as recited in claim 16 wherein the polymer has a melting temperature lower than approximately 400° C.

19. The method as recited in claim 16 wherein the step of applying a sacrificial coating to at least one surface of a substrate comprises applying a sacrificial coating to at least one surface of a ceramic substrate.

20. The method as recited in claim 17 wherein the step of laser drilling the substrate comprises laser drilling the substrate with at least one of an excimer laser and a YAG laser.

21. The method as recited in claim 16 wherein the step of applying a sacrificial coating to at least one side of a substrate comprises applying a sacrificial coating to at least one side of a substrate having a thickness of greater than approximately 100 microns.

22. The method as recited in claim 16 wherein the step of laser drilling the substrate comprises laser drilling the substrate so as to form a through-hole having a diameter of less than approximately 50 microns.

23. The method as recited in claim 16 wherein the step of laser drilling the substrate comprises laser drilling the substrate so as to form a via through-hole having an aspect ratio of greater than approximately 2.

24. A method for forming a conductive via interconnect, the method comprising the steps of:

a) applying a sacrificial coating to at least one surface of a substrate having a thickness of greater than approximately 100 microns;

b) laser drilling the substrate through the sacrificial coating to form a via through-hole;

c) applying a conductive coating to the via through-hole; and d) removing the at least one sacrificial coating(s);

e) wherein recasting and shattering occur in the sacrificial coating(s) rather than in the substrate during the step of laser drilling so as to enhance via through-hole geometry.

25. The method as recited in claim 24 wherein the step of applying a sacrificial coating to at least one surface of the substrate comprises applying a sacrificial coating to two surfaces of the substrate.

26. The method as recited in claim 24 wherein the step of applying a sacrificial coating comprises applying a high melting temperature polymer.

27. The method as recited in claim 26 wherein the polymer has a melting temperature less than approximately 400° C.

28. The method as recited in claim 26 wherein the polymer has a melting temperature less than approximately 400° C. and further comprising the step of filling the via through-hole with a glass dielectric composition fireable between approximately 500° and 800° C.

29. The method as recited in claim 24 wherein the step of applying a sacrificial coating to at least one surface of a substrate comprises applying a sacrificial coating to at least one surface of a ceramic substrate.

30. The method as recited in claim 24 wherein the step of laser drilling the substrate comprises laser drilling the substrate with at least one of an excimer laser and a YAG laser.

31. The method as recited in claim 24 wherein the step of laser drilling the substrate comprises laser drilling the substrate so as to form a through-hole having a diameter of less than approximately 50 microns.

32. The method as recited in claim 24 wherein the step of laser drilling the substrate comprises laser drilling the substrate so as to form a via through-hole having an aspect ratio of greater than approximately 2.

33. The method as recited in claim 24 wherein the step of applying a conductive coating to said via through-hole comprises screen printing.

34. The method as recited in claim 24 wherein the step of applying a conductive coating to said via through-hole comprises spraying.

35. The method as recited in claim 24 further comprising the steps of filling the via through-hole with an insulator after the step of applying a conductive coating to the via through-hole and then sintering.

36. The method as recited in claim 24 further comprising the step of filling the via through-hole with glass after the step of applying a conductive coating to the via through-hole and then sintering.

37. The method as recited in claim 24 wherein the step of applying a sacrificial coating comprises applying an organic sacrificial coating and further comprising the step of sintering the conductive coating applied to the via through-hole at a temperature above the decomposition point of the sacrificial coating so as to cause the sacrificial coating to decompose.

38. The method as recited in claim 37 further comprising the step of removing the decomposed sacrificial coating by dusting off residual ashes formed by sintering of the sacrificial coating.

39. A method for forming a conductive via interconnect, the method comprising the steps of:
  a) applying an organic sacrificial coating to at least one surface of a substrate;
  b) laser drilling the substrate through the sacrificial coating to form a via through-hole;
  c) applying a conductive coating to the via through-hole;
  d) sintering the conductive coating applied to the via through-hole at a temperature above the decomposition point of the sacrificial coating so as to cause the sacrificial coating to decompose; and
  e) removing the at least one sacrificial coating(s);
  f) wherein recasting and shattering occur in the sacrificial coating(s) rather than in the substrate during the step of laser drilling so as to enhance via through-hole geometry.

40. The method as recited in claim 39 wherein the step of applying the sacrificial coating to at least one surface of the substrate comprises applying a sacrificial coating to two surfaces of the substrate.

41. The method as recited in claim 39 wherein the step of applying the sacrificial coating comprises applying a high melting temperature polymer.

42. The method as recited in claim 41 wherein the polymer has a melting temperature less than approximately 400° C.

43. The method as recited in claim 41 wherein the polymer has a melting temperature less than approximately 400° C. and further comprising the step of filling the via through-hole with a glass dielectric composition fireable between approximately 500° and 800° C.

44. The method as recited in claim 39 wherein the step of applying the sacrificial coating to at least one surface of a substrate comprises applying a sacrificial coating to at least one surface of a ceramic substrate.

45. The method as recited in claim 39 wherein the step of laser drilling the substrate comprises laser drilling the substrate with at least one of an excimer laser and a YAG laser.

46. The method as recited in claim 39 wherein the step of applying a sacrificial coating to at least one side of a substrate comprises applying a sacrificial coating to at least one side of a substrate having a thickness of greater than approximately 100 microns.

47. The method as recited in claim 39 wherein the step of laser drilling the substrate comprises laser drilling the substrate so as to form a through-hole having a diameter of less than approximately 50 microns.

48. The method as recited in claim 39 wherein the step of laser drilling the substrate comprises laser drilling the substrate so as to form a via through-hole having an aspect ratio of greater than approximately 2.

49. The method as recited in claim 39 wherein the step of applying a conductive coating to said via through-hole comprises screen printing.

50. The method as recited in claim 39 wherein the step of applying a conductive coating to said via through-hole comprises spraying.

51. The method as recited in claim 39 further comprising the steps of filling the via through-hole with an insulator after the step of applying a conductive coating to the via through-hole and then sintering.

52. The method as recited in claim 39 further comprising the step of filling the via through-hole with glass after the step of applying a conductive coating to the via through-hole and then sintering.

53. The method as recited in claim 39 further comprising the step of removing the decomposed sacrificial coating by dusting off residual ashes formed by sintering of the sacrificial coating.

54. A method for forming a via through-hole, the method comprising the steps of:
  a) applying a sacrificial coating formed as a polymide to at least one surface of a substrate;
  b) laser drilling the substrate through the sacrificial coating to form a via through-hole; and
  c) removing the at least one sacrificial coating(s);
  d) wherein recasting and shattering occur in the sacrificial coating(s) rather than in the substrate during the step of laser drilling so as to enhance via through-hole geometry.

55. The method as recited in claim 54 wherein the step of applying a sacrificial coating to at least one surface of the substrate comprises applying a sacrificial coating to two surfaces of the substrate.

56. The method as recited in claim 54 wherein the step of applying a sacrificial coating to at least one surface of a substrate comprises applying a sacrificial coating to at least one surface of a ceramic substrate.

57. The method as recited in claim 54 wherein the step of laser drilling the substrate comprises laser drilling the substrate with at least one of an excimer laser and a YAG laser.

58. The method as recited in claim 54 wherein the step of applying a sacrificial coating to at least one surface of a substrate comprises applying a sacrificial coating to at least one surface of a substrate having a thickness of greater than approximately 100 microns.

59. The method as recited in claim 54 wherein the step of laser drilling the substrate comprises laser drilling the substrate so as to form a through-hole having a diameter of less than approximately 50 microns.

60. The method as recited in claim 54 wherein the step of laser drilling the substrate comprises laser drilling the substrate so as to form a via through-hole having an aspect ratio of greater than approximately 2.

61. A method for forming a via through-hole, the method comprising the steps of:
   a) applying a sacrificial coating to at least one surface of a substrate having a thickness of approximately greater than 100 microns;
   b) laser drilling the substrate through the sacrificial coating to form a via through-hole; and
   c) removing the at least one sacrificial coating(s);
   d) wherein recasting and shattering occur in the sacrificial coating(s) rather than in the substrate during the step of laser drilling so as to enhance via through-hole geometry.

62. The method as recited in claim 61 wherein the step of applying a sacrificial coating to at least one surface of the substrate comprises applying a sacrificial coating to two surfaces of the substrate.

63. The method as recited in claim 61 wherein the step of applying a sacrificial coating comprises applying a polymer.

64. The method as recited in claim 63 wherein the polymer has a melting temperature lower than approximately 400° C.

65. The method as recited in claim 61 wherein the step of applying a sacrificial coating comprises applying a polymide.

66. The method as recited in claim 61 wherein the step of applying a sacrificial coating comprises applying a polymide.

67. The method as recited in claim 61 wherein the step of applying a sacrificial coating to at least one surface of a substrate comprises applying a sacrificial coating to at least one surface of a ceramic substrate.

68. The method as recited in claim 61 wherein the step of laser drilling the substrate comprises laser drilling the substrate with at least one of an eximer laser and YAG laser.

69. The method as recited in claim 61 wherein the step of laser drilling the substrate comprises laser drilling the substrate so as to form a via through-hole having an aspect ratio of greater than approximately 2.

\* \* \* \* \*